(12) United States Patent
Martin et al.

(10) Patent No.: US 11,880,145 B2
(45) Date of Patent: Jan. 23, 2024

(54) METHOD FOR MEASURING A SUBSTRATE FOR SEMICONDUCTOR LITHOGRAPHY

(71) Applicant: Carl Zeiss SMT GmbH, Oberkochen (DE)

(72) Inventors: Sven Martin, Jena (DE); Oliver Jaeckel, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/973,645

(22) Filed: Oct. 26, 2022

(65) Prior Publication Data

US 2023/0136478 A1 May 4, 2023

(30) Foreign Application Priority Data

Oct. 29, 2021 (DE) .......................... 102021128222.5

(51) Int. Cl.
*G03F 1/84* (2012.01)
*G03F 7/00* (2006.01)

(52) U.S. Cl.
CPC .............. *G03F 7/7085* (2013.01); *G03F 1/84* (2013.01); *G03F 7/70258* (2013.01); *G03F 7/706* (2013.01)

(58) Field of Classification Search
CPC .... G03F 7/7085; G03F 7/70258; G03F 7/706; G03F 7/7055; G03F 7/70591; G03F 7/70616–70683; G03F 7/70483–70541; G03F 7/70358; G03F 7/704; G03F 1/22; G03F 1/68; G03F 1/82; G03F 1/84; G03F 9/70; G03F 9/7003; G03F 9/7019; G03F 9/7023; G03F 9/7026; G03F 9/703; G03F 9/7034; G03F 9/7088; G03F 9/7092; G03F 7/705; G03F 7/70605–706851; G02B 21/36; G02B 21/365; G02B 21/367
USPC .... 355/18, 30, 52–55, 67–77; 356/399–401; 430/5, 22, 30
See application file for complete search history.

(56) References Cited

U.S. PATENT DOCUMENTS

2007/0247640 A1* 10/2007 Magome ............... G03F 9/7011
356/601
2021/0158496 A1* 5/2021 Bouchard ................. G06T 5/50
2022/0011679 A1* 1/2022 Tezuka .................. G03F 7/7085
(Continued)

FOREIGN PATENT DOCUMENTS

DE 102020123615 10/2020
EP 2 728 392 5/2014
(Continued)

OTHER PUBLICATIONS

English translation of WO2020/119863, published Jun. 18, 2020. (Year: 2020).*

(Continued)

*Primary Examiner* — Christina A Riddle
(74) *Attorney, Agent, or Firm* — Fish & Richardson P.C.

(57) ABSTRACT

A method for measuring a substrate for semiconductor lithography using a measuring device, wherein the measuring device comprises a recording device for capturing at least a partial region of the substrate and, wherein the distance between the substrate and an imaging optical unit of the recording device is varied while the partial region is captured by the recording device.

15 Claims, 4 Drawing Sheets

(56) References Cited

U.S. PATENT DOCUMENTS

2022/0057721 A1\* 2/2022 Ruecker .................. G03F 9/00
2022/0075272 A1 3/2022 Matejka et al.

FOREIGN PATENT DOCUMENTS

WO WO-2008109908 A1 \* 9/2008 ............. G01B 11/24
WO WO-2020119863 A1 \* 6/2020 ............. B05C 11/00

OTHER PUBLICATIONS

English translation of WO2008/109908, published Sep. 18, 2008. (Year: 2008).\*
The Office Action issued by the German Patent Office for Application No. DE 10 2021 128 222.5, dated Oct. 24, 2022 (With English Translation).

\* cited by examiner

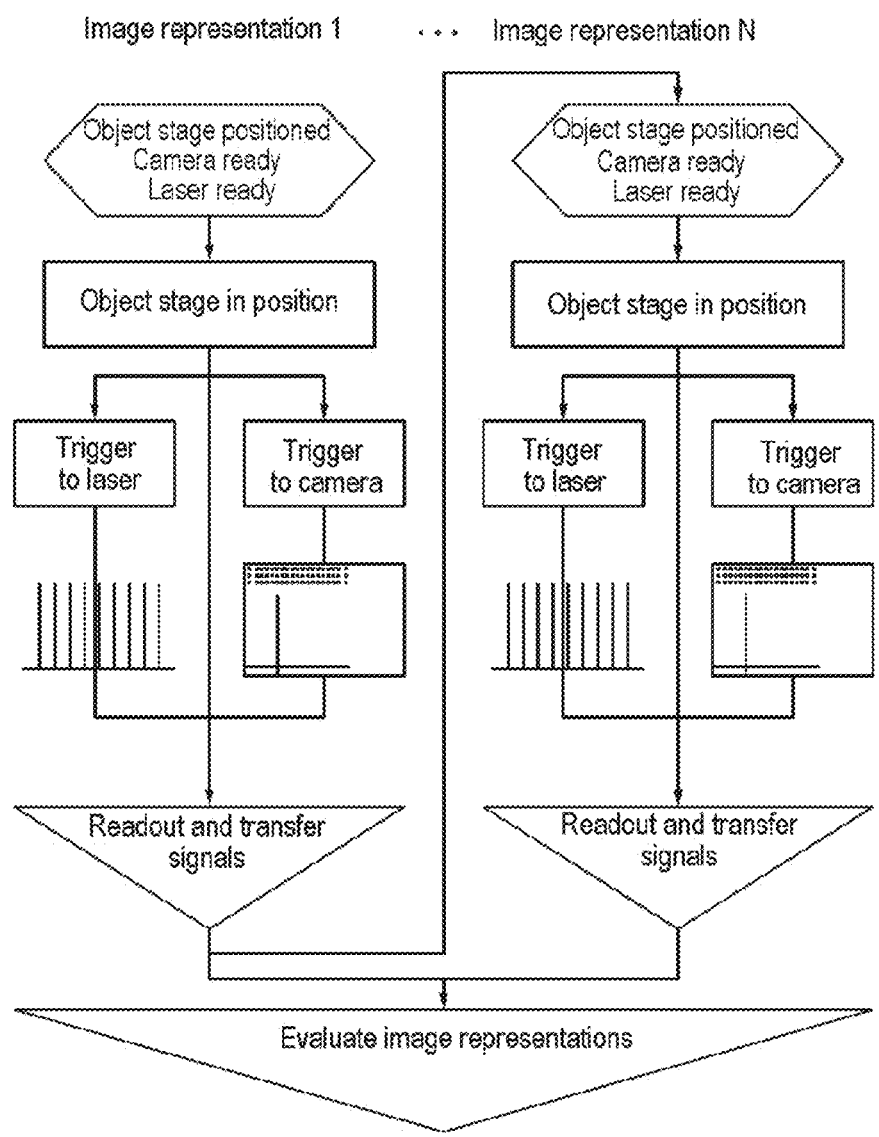

METHOD FOR MEASURING A SUBSTRATE FOR SEMICONDUCTOR LITHOGRAPHY

CROSS-REFERENCE TO RELATED APPLICATIONS

The present patent application claims priority from German patent application DE 10 2021 128 222.5, filed on Oct. 29, 2022, the content of which is fully incorporated by reference herein.

TECHNICAL FIELD

The invention relates to a method for measuring a substrate for semiconductor lithography.

BACKGROUND

In the metrology of objects such as substrates, which may be formed for example as photomasks for semiconductor lithography, defocusing information, that is to say how imaging changes when there are differing degrees of defocusing of the imaging, is of great importance in the measurement of the substrates. Usually, a so-called focus stack of the image representation of the substrate is produced by the moving of the measuring table or the support on which the substrate lies, that is to say a number of image representations are recorded one after the other for different z positions of the measuring table or the support; the z direction in this case corresponds substantially to the normal on the focal plane of the optical system used for measurement purposes. The individual image representations of the focus stack can then be used for example to make an assertion about the so-called printability, that is to say the correct imaging of an object onto a wafer in a projection exposure apparatus over a region around the best focus. The best focus is in this case the distance of the object from the imaging optical unit at which the image is in sharpest focus.

The determination of the position of one or more partial regions of the object, the so-called regions of interest (ROI), is a further application in which the focus stack is used. Usually, a focus stack is captured for each partial region in order to determine the best focus of the imaging device and this focus stack is used as a basis for determining the precise position of the partial region. If a plurality of partial regions are situated within the captured region of the detector unit, the so-called field of view (FoV), then the individually different positions of the individual partial regions may also be determined from a single focus stack.

The image representations of the focus stack should be captured as quickly as possible in order to ensure a high throughput. One way of producing the focus stack known in the prior art, in which a region around the expected focus in the imaging direction (z-direction), which is also referred to as the defocus region, is measured by way of many individual images at defined positions and used to determine the best focus and the precise position of the partial region on the object, does not, however, satisfy the conditions in respect of throughput.

SUMMARY

In general, in one aspect, disclosed is a method for measuring a substrate for semiconductor lithography using a measuring device, the measuring device comprising a recording device for capturing at least a partial region of the substrate, and in the method the distance between the substrate and an imaging optical unit of the recording device is varied while the partial region is captured by the recording device. This is advantageous in that there is no need to take times for positioning procedures, that is to say the displacement from a first predetermined measurement position to a further predetermined measurement position and the settling time for calming the system once the further measurement position has been reached, into consideration between the capture of the at least two image representations. The unsharpness of the image representation produced as a result of varying the distance during the capture of the image representation can be compensated by the image evaluation tools used in mask inspection of microscopes.

Furthermore, the distance can be varied at a constant speed. This is advantageous in that each captured image representation, which has an exposure time of 200 ms for example, always includes the same change in distance.

In particular, the distance between the substrate and the imaging optical unit can be varied by way of a movable object stage which holds the substrate. The latter can be positioned in lateral and vertical direction with an accuracy of 100 nm to 20 nm such that, initially, a partial region of the substrate to be measured is brought into the captured region of the recording device and subsequently a position below or above the first measured position of a so-called focus stack, that is to say a plurality of image representations about a best focus, is homed in on. The movement of the object stage is preferably from the bottom upward, that is to say against the direction of gravity, as this advantageously allows play present in mechanical drives or a hysteresis in the drive to be minimized.

In the process, the position of the object stage can be detected continually while the object stage is moved. As a result, it is possible, in a targeted manner, to evaluate only the vertical and lateral positions corresponding to the time interval in which the image representations are captured, as a result of which the accuracy of the evaluation is advantageously increased.

In a first embodiment, the partial region of the substrate can be captured by the recording device by way of capturing individual image representations. Within the meaning of the invention, this should be understood to mean that each capture of an image representation is actively started by a pulse from outside of the recording device, for example from a controller of the measuring device, in a manner comparable to triggering a photography camera. Technology-induced idle times may occur between the capture of the image representations, for example for reading the buffer arranged on a CCD chip of the recording device.

In a further embodiment, the image representations can be captured continually by the recording device. Within the meaning of the application, continually is understood to mean that all captured image representations are captured in succession without a new pulse from outside of the recording device, for example from the controller of the measuring device. If necessary, the capture of the individual image representations is only interrupted for a period of time, for example 200 ns, necessitated by technology, during which the captured signals are moved into a buffer formed on the CCD chip of the recording device. This type of capture is also referred to as video mode.

In particular, all image representations captured by the recording device are used to determine the position of the partial region on the substrate. This advantageously minimizes the overall time required to determine the position of the partial region on the substrate.

Furthermore, the recording device may be started by a trigger from outside the recording device. In this case, the overall controller of the measuring device or the control of the object stage may trigger the trigger. In this case, the trigger should be understood to mean a start signal for starting a process step, in this case the start of the recording device.

In particular, the trigger can be triggered after a constant speed of the object stage and a first predetermined measurement position are reached. This is advantageous in that capturing of the image representations is only started once the preconditions for using the image representation are met, which in this case are a constant speed of the object stage and, resulting therefrom, a variation in the distance between the substrate and the optical unit of the recording device, and the arrival at the first measurement position of the focus stack.

Furthermore, an illumination of the partial region can be started on the basis of a signal level output by the recording device and the positions of the object stage detected during the illumination can be marked. The illumination, which comprises a pulsed laser for example, is activated if a certain threshold value of the signal level is exceeded.

In particular, only the image representations recorded at the marked positions of the object stage might be used for the evaluation to determine the position of the partial region on the substrate. The assignment of the positions to the image representations which can be used to evaluate the individual image representations advantageously increases the accuracy and reproducibility of the determination of the position of the partial region on the substrate.

Furthermore, the image representations that are out-of-focus as a result of varying the distance between the substrate and the optical unit of the recording device can be evaluated on the basis of a statistical method. In the case of mask inspection microscopes as already known from the prior art, the accuracy and reproducibility required for determining the position of the partial region on the substrate is usually a factor of 10 to 50 below the resolution of the utilized recording devices, such as a CCD camera for example. As a result, the image evaluation already applies methods and algorithms which evaluate out-of-focus image representations within the meaning of the application. The additional unsharpness as a result of varying the distance has no influence on the accuracy or reproducibility of the determined positions of the partial region on the substrate since the positional variations can be determined during the image recording and can be taken into account within the scope of the image processing. As a result of the when capturing conventionally seven image representations for determining the best focus, it is possible to achieve the same accuracy and reproducibility within a shorter period of time. Alternatively, additional image representations may be captured, for example a total of fifteen image representations, if the same amount of time is used as is required in the prior art for the capture of individual image representations. As a result, the accuracy and reproducibility can advantageously be increased by up to 25% on the basis of the algorithms based on statistics that are used during the evaluation.

All documents referred to herein, if any, are incorporated by reference in their entirety. In case of conflict with the present disclosure, and any document incorporated by reference, the present disclosure controls.

The details of one or more embodiments of the are set forth in the accompanying drawings and the description below. Other features, objects, and advantages will be apparent from the description and drawings, and from the claims.

DESCRIPTION OF DRAWINGS

Exemplary embodiments and variants are explained in more detail below with reference to the drawing, in which FIGS. 3A and 3B show a flowchart known from the prior art and a flowchart according to the invention, in each case for an image capture.

DETAILED DESCRIPTION

Figure 1:
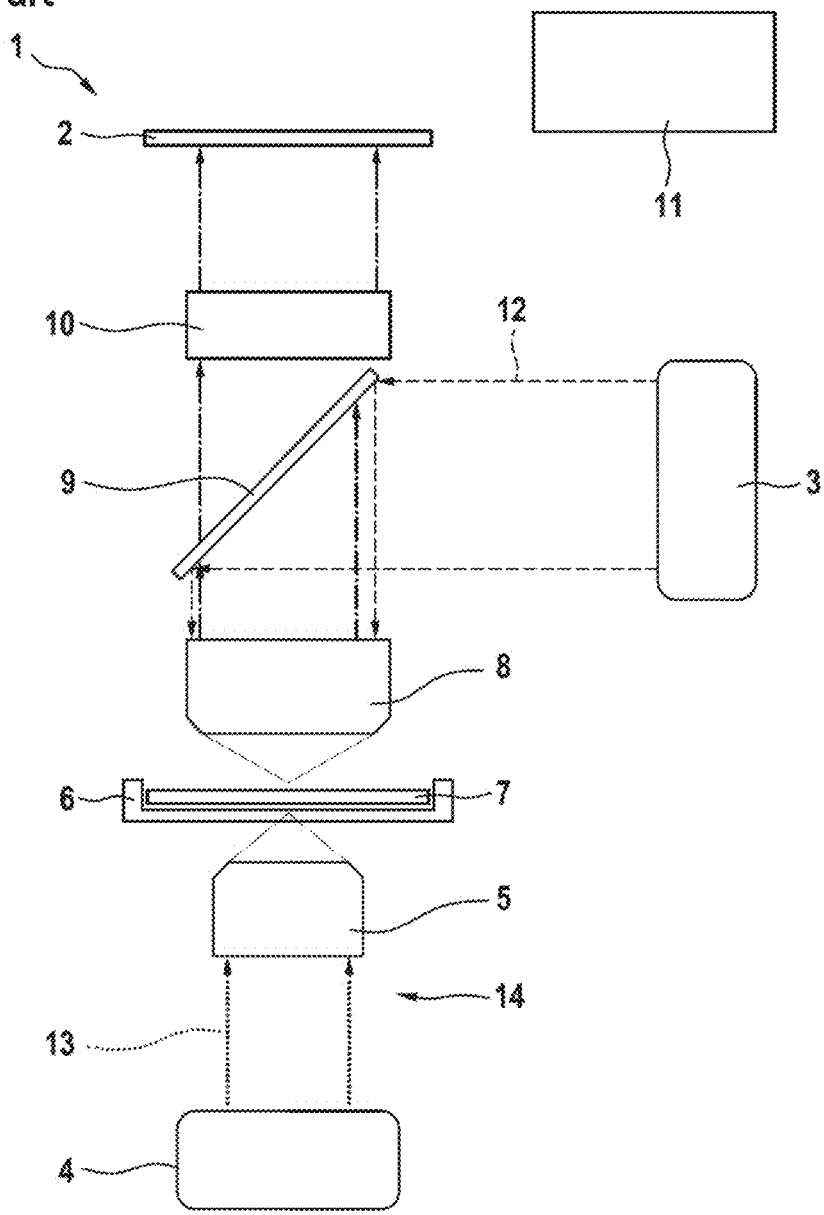
FIG. 1 shows a schematic structure of a device from the prior art.

FIG. 1 shows a schematic representation of a mask inspection microscope 1 known from the prior art, which is used for measuring a substrate in the form of a semiconductor lithography structure 7, which may be in the form of photomask for example, and in which the invention may be implemented. The mask inspection microscope 1 comprises two light sources 3, 4, with a first light source 3 being designed for a measurement of the semiconductor lithography structure 7 in reflection and a second light source 4 being designed for a measurement of the semiconductor lithography structure 7 in transmission. The semiconductor lithography structure 7 is arranged on an object stage 6, which can position the semiconductor lithography structure 7 laterally and vertically. In this case, the positional accuracy can be in particular in a range of less than 100 nm, in particular less than 20 nm. During a transmitted-light measurement, the measurement light 13 of the illumination unit 14, which comprises the light source 4 and an illumination optical element embodied as a condenser 5, passes through the condenser 5, which generates a desired light distribution on the semiconductor lithography structure 7. The measurement light 13 passes further through the semiconductor lithography structure 7, which is subsequently imaged by an imaging optical element 8 and a tube 10. The tube 10 magnifies the image representation of the semiconductor lithography structure 7 and images it in turn on a recording device 2 embodied as a CCD camera, which is used to capture the image representations. The partly transparent mirror 9 arranged between the imaging optical element 8 and the tube 10 is used for the measurement in reflection and has no influence on the measurement in transmitted light.

During a measurement in reflection, the measurement light 12 emitted by the light source 3 is reflected at the partly transparent mirror 9 and then impinges on the imaging optical element 8. The latter focuses the measurement light 12 on the semiconductor lithography structure 7, from which it is reflected. The measurement light 12 passes once more through the imaging optical element 8 and the latter images the semiconductor lithography structure 7 through the semi-transparent mirror 9 and the tube 10. The tube 10 magnifies the image representation of the semiconductor lithography structure 7 and images it on the recording device 2. The mask inspection microscope 1 comprises a controller 11, which controls and/or regulates the positioning of the object stage 6 and the switchover between a measurement in reflection and a transmitted-light measurement, and which is also used to evaluate the image representations captured by means of the mask inspection microscope 1.

Figure 2A:
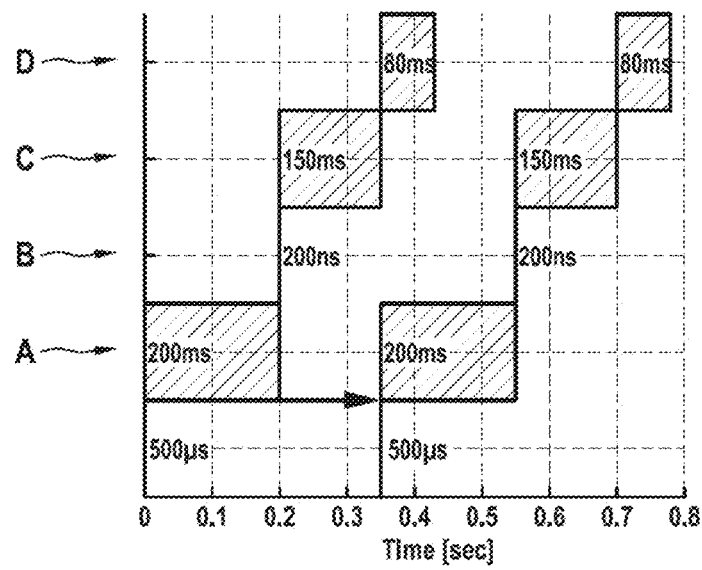
FIGS. 2A and 2B show a timing diagram known from the prior art and a timing diagram according to the invention, in each case for an image capture.

FIG. 2A shows a timing diagram of a displacement, known from the prior art, of at least two image representations for determining a best focus or for measuring the position of a partial region on the semiconductor lithography structure 7. Usually, 7 to 15 image representations, each with a different distance between the object and the optical unit of a mask inspection microscope 1 as described in FIG. 1, are recorded to determine the best focus, which is why these image representations are also referred to as a focus stack. To create such a focus stack, the object stage 6 depicted in FIG. 1 is positioned at a predetermined position by the controller 11, with said object stage being moved in the lateral and vertical direction to this end. In this case, lateral is substantially parallel to the focal plane of the mask inspection microscope 1, with the perpendicular direction also being referred to as z-direction. The illumination of the partial region which is represented by the lower most line, denoted by A, in the timing diagram of FIG. 2A is started. At the same time, a CCD chip of the recording device 2 designed as a CCD camera captures the image representation imaged by the optical unit of the mask inspection microscope 1 onto a CCD chip of the recording device 2. The illumination time is 200 ms in the exemplary embodiment shown. After the 200 ms have expired, the illumination, which comprises a laser for example, is deactivated and the signals captured by the CCD chip are shifted to the buffer present directly on the CCD chip during a time interval of 200 ns, as depicted in the timing diagram in FIG. 2A in the line denoted by B. From there, the signals are read in 150 ms, as depicted in the timing diagram in FIG. 2A in the line denoted by C. Subsequently, in a further 80 ms, the signals are transferred to the controller 11 of the mask inspection microscope 1, already explained in relation to FIG. 1, in the line denoted by D by way of a connection, for example by way of what is known as FireWire, USB, GPM or an optical data transfer. The image representations are evaluated and, after the last image representation has been captured and evaluated, the position of the partial region on the semiconductor lithography structure 7 is determined from all image representations of the focus stack in said controller. The second image representation can only be captured once the signals from the capture of the first image representation have been read from the buffer, that is to say after the step depicted in line C of the timing diagram. By contrast, transmitting the signals to the controller 11 (line D) can be carried out in parallel with the capture of the second image representation. In the time interval following the first capture of the image representation, the object stage 6 moves in the vertical direction of the optical axis of the mask inspection microscope 1 to the subsequent position of the focus stack. The latter is usually reached within the 150 ms required to read the CCD chip, which time includes a settling time required after the position has been reached, that is to say the time until the system is stationary again following the pulse brought about by the displacement.

Figure 2B:
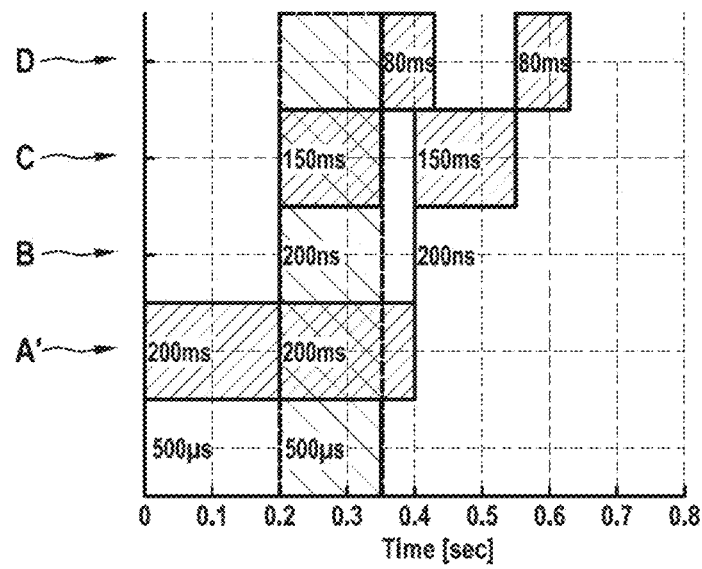

FIG. 2B shows a timing diagram of a method according to the invention, which depicts the temporal sequence of the individual method steps. In contrast to the individual capture of the image representations as explained in relation to FIG. 2A, the image representations are captured in a video mode represented in line A' in the timing diagram. In this context, video mode means that the capture of the image representations, once started, is implemented continually. The capture of the image representations is only interrupted by a transfer of the captured signals into the buffer situated on the CCD chip, as depicted in line B in the timing diagram and as takes 200 ns in this example. The illumination duration still is 200 ms, with the latter and the number of image representations recorded in the video mode being able to be set as a matter of principle. In this mode, the next image recording starts simultaneously with the readout of the signals from the buffer (line C). The transfer times (line D) of the signals from the CCD chip to the controller 11 are parallel in time with the capture of the image representations. An optimal image recording rate is obtained if the illumination time is longer than or equal to the readout time of the signals. Moreover, the object stage 6 is moved continuously, in particular at a constant speed, in the vertical direction, as a result of which the image representations are recorded while the object stage 6 is in motion. The image representations which are out of focus as a result are corrected during the evaluation of the image representations in the controller 11. The accuracy and reproducibility required for determining the position of the partial region on the semiconductor lithography structure 7 is usually a factor of 10 to 50 below the resolution of the recording devices 2 used in mask inspection microscopes 1, and so the image evaluation already evaluates image representations that are out of focus within the meaning of the application, even in the case of the method known from the prior art. The method according to the invention is advantageous in that the time required for positioning and for the settling time are reduced toward zero as a result of the continual motion of the object stage (even in the case of single image recordings). The additional use of the video mode is furthermore advantageous in that the readout time still required in the case of an individual capture of the image representations is reduced to the minimum required from a technological point of view.

FIG. 3A shows a flowchart of the method known from the prior art, which was explained in FIG. 2A on the basis of a timing diagram. The object stage 6 is displaced to a predetermined lateral and vertical position in a first method step. After the position has been reached within a predetermined tolerance, the control of the object stage 6 provides a trigger signal in the form of a pulse to the illumination control and to the control of the recording device 2, which are both partial systems of the controller 11 explained in FIG. 1, in a second method step. As a result, the illumination, for example a laser, and the capture of the image representation are started for a fixed duration, which is 200 ms in the embodiment explained in FIG. 2A, in a third method step. After the image representation has been captured, the signals required for the evaluation, for example the position of the object stage 6, and the signals of the captured image representation are transmitted to the controller 11 in a fourth method step. The controller 11 evaluates the signals in a fifth method step. At the same time, the controller 11 provides a signal to the control of the object stage 6 and the object stage 6 homes in on the next predetermined position, where the above-described method repeats. This is carried out until the last position, denoted by N in FIG. 3A, is reached. Once all image representations have been captured, transferred and evaluated, the position of the partial region on the substrate is determined on the basis of all captured image representations, with algorithms based on statistical methods being used to this end.

Figure 3B:
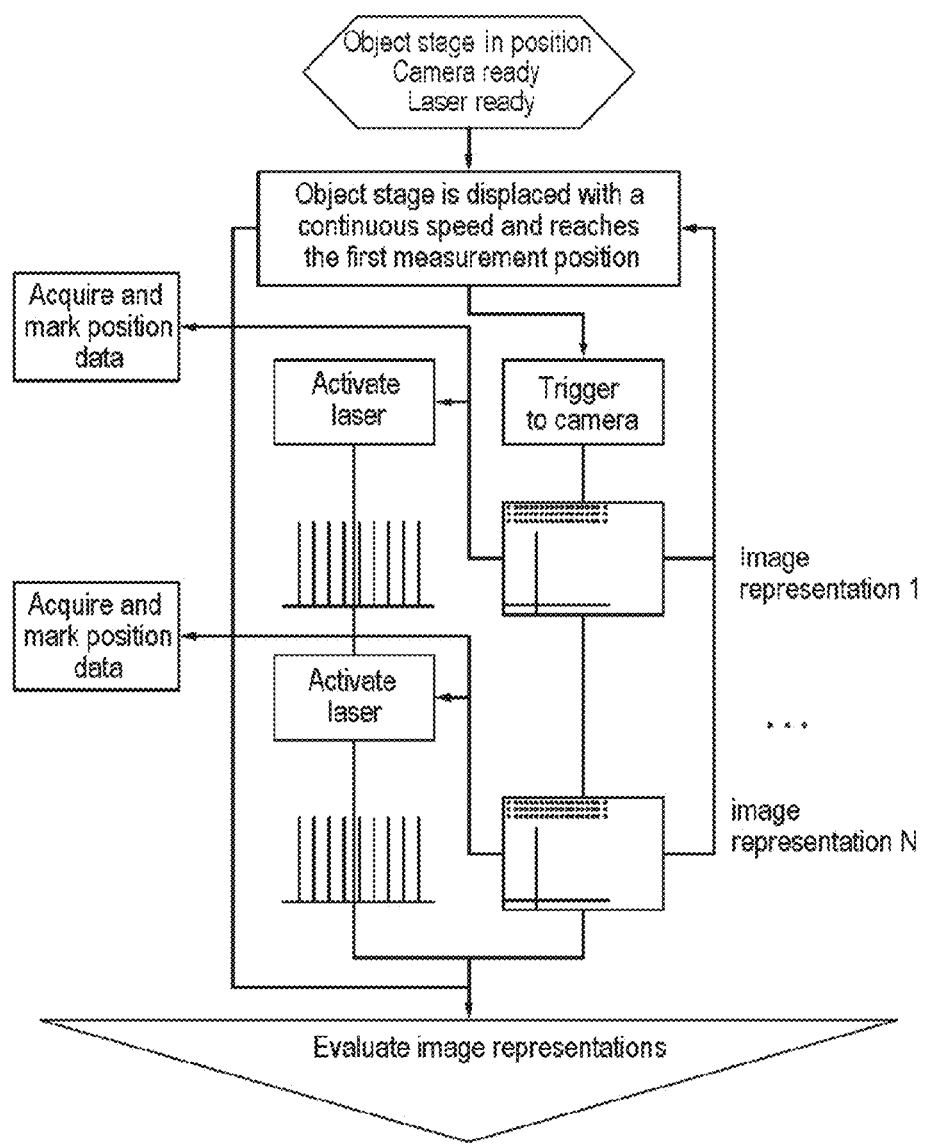

FIG. 3B shows a flowchart of the method according to the invention, which was explained in FIG. 2B on the basis of a timing diagram. In contrast to the flowchart explained in FIG. 3A, the object stage 6, in a first method step, initially homes in on a position located just above or below the region to be captured, with the positions for capturing the image representations of the focus stack for the purposes of determining the best focus preferably being passed through from bottom to top, that is to say against gravity. Proceeding from this starting position, the continual movement of the object stage 6 is started in a second method step, with the illumination and the recording device 2 having a status that allows the illumination or the recording device 2 to be started without time delay. As soon as the object stage 6 moves at a constant speed and the vertical position for the first image representation of the focus stack has been reached, a trigger in the form of a pulse is transmitted to the recording device 2 by the controller of the object stage 6 in a third method step. The said recording device 2 in turn outputs a signal level, on the basis of which—that is to say when a certain threshold value is exceeded—the start of the capture in the video mode is initiated in a fourth method step. Furthermore, the illumination is activated when the threshold value is exceeded, and the constant lateral and continually changing vertical z-position is captured by the control of the object stage 6. The signal level of the recording device 2 is above the threshold value for as long as the recording device 2 is in the process of capturing the image representation, and is below the threshold value for 200 ns when the recording device 2 writes the signals captured by the recording device 2 into the buffer or when the predetermined number of image representations have been captured following the illumination time, that is to say after 200 ms according to the method explained in FIG. 2B.

Expressed differently, the threshold value being overshot causes the illumination to be started and the continually captured position data to be marked during a capture of an image representation. The threshold value being undershot causes the illumination to be stopped, that is to say no light falls on the substrate 7, and causes the controller to detect that the position data captured thereby are captured without illumination. In a fifth method step, the illumination is deactivated during the readout into the buffer since a continual exposure of the CCD chip used in the recording device 2 may lead to falsification of the measurement results as it is not possible in this case to ensure that the same amount of light is captured for each image representation. This is related to the above-described functionality of the buffer on the CCD chip, which is read line-by-line, as a result of which the light is distributed among two images and leads to an unwanted uneven brightness distribution. As described further above, the control of the object stage 6 acquires all position data, with only the position data corresponding to the captured image representations being used for the subsequent evaluation of the individual image representations. As described, positions captured during the readout into the buffer of the CCD chip can be retrospectively identified and can be left unconsidered during the calculation of the positions. The signal level is again returned to high—that is to say above the threshold value—with the start of the next image representation, as a result of which the illumination is started and the control of the object stage 6 acquires the position data during the imaging. Once the last image representation is complete, the object stage 6 is stopped and the evaluation of the focus stack starts. As a result of its faster succession during the capture of the image representations, the method according to the invention is advantageous in that either the same number of image representations can be captured within a shorter period of time or a higher accuracy and reproducibility can be achieved during the same amount of time. The determination of the position of the partial region from an out-of-focus image representation is based, inter alia, on statistical considerations, as a result of which more data leads to an improved or more accurate determination of the position.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

LIST OF REFERENCE SIGNS

1 Mask inspection microscope
2 Recording device, CCD camera
3 Light source for reflection
4 Light source for transmitted light
Condenser
6 Object stage
7 Semiconductor lithography structure, especially photomask or wafer
8 Imaging optical unit
9 Mirror
Tube
11 Controller
12 Measurement light (reflection beam path)
13 Measurement light (transmitted-light beam path)
14 Illumination unit
A Illumination time
A' Illumination time
B Storage on the detector
C Readout time of the detector
D Transfer time to the controller

What is claimed is:

1. A method for measuring a substrate for semiconductor lithography using a measuring device, the measuring device comprising a recording device for capturing at least a partial region of the substrate,
wherein
the distance between the substrate and an imaging optical unit of the recording device is varied while the partial region is captured by the recording device,
wherein
the recording device is started by a trigger from outside the recording device, and
wherein
the trigger is triggered after a constant speed of the object stage and a first predetermined measurement position are reached.

2. The method of claim 1,
wherein
the distance is varied at a constant speed.

3. The method of claim 1,
wherein
the distance between the substrate and the imaging optical unit is varied by way of a movable object stage which holds the substrate.

4. The method of claim 3,
wherein
the position of the object stage is detected continually while the object stage is moved.

5. The method of claim 4,
wherein
an illumination of the partial region is started on the basis of a signal level output by the recording device and the positions of the object stage detected during the illumination are marked.

6. The method of claim 5,
wherein only the image representations recorded at the marked positions of the object stage are used for the evaluation to determine the position of the partial region on the substrate.

7. The method of claim 1, wherein
the partial region of the substrate is captured by the recording device by way of capturing individual image representations.

8. The method of claim 7, wherein
all captured image representations are used to determine the position of the partial region of the substrate.

9. The method of claim 1, wherein
the image representations are captured continually by the recording device.

10. The method of claim 9, wherein
all captured image representations are used to determine the position of the partial region of the substrate.

11. The method of claim 1, wherein
an illumination of the partial region is started on the basis of a signal level output by the recording device and the positions of the object stage detected during the illumination are marked.

12. The method of claim 11, wherein
only the image representations recorded at the marked positions of the object stage are used for the evaluation to determine the position of the partial region on the substrate.

13. The method of claim 1, wherein
the image representations that are out of focus as a result of varying the distance are evaluated on the basis of a statistical method.

14. The method of claim 13, wherein
the distance between the substrate and the imaging optical unit is varied by way of a movable object stage which holds the substrate.

15. The method of claim 14, wherein
the position of the object stage is detected continually while the object stage is moved.

* * * * *

UNITED STATES PATENT AND TRADEMARK OFFICE
CERTIFICATE OF CORRECTION

| | | |
|---|---|---|
| PATENT NO. | : 11,880,145 B2 | Page 1 of 1 |
| APPLICATION NO. | : 17/973645 | |
| DATED | : January 23, 2024 | |
| INVENTOR(S) | : Sven Martin and Oliver Jaeckel | |

It is certified that error appears in the above-identified patent and that said Letters Patent is hereby corrected as shown below:

In the Specification

<u>Column 1</u>
Line 9, delete "2022" and insert -- 2021 --

<u>Column 8</u>
Line 13 (Approx.), before "Condenser" insert -- 5 --
Line 20 (Approx.), before "Tube" insert -- 10 --

Signed and Sealed this
Twenty-sixth Day of November, 2024

Katherine Kelly Vidal
*Director of the United States Patent and Trademark Office*